United States Patent [19]

Perlegos et al.

[11] 4,266,283
[45] May 5, 1981

[54] ELECTRICALLY ALTERABLE READ-MOSTLY MEMORY

[75] Inventors: George Perlegos, Cupertino; William S. Johnson, Palo Alto, both of Calif.

[73] Assignee: Intel Corporation, Santa Clara, Calif.

[21] Appl. No.: 12,670

[22] Filed: Feb. 16, 1979

[51] Int. Cl.³ .............................................. B11C 11/40
[52] U.S. Cl. .................................. 365/104; 365/182; 357/23; 307/238.3
[58] Field of Search .................. 365/174, 104; 357/23, 357/24; 307/238

[56] References Cited

U.S. PATENT DOCUMENTS

| | | | |
|---|---|---|---|
| 3,825,946 | 7/1974 | Frohman-Bentchkowsky | 357/23 |
| 4,119,995 | 10/1978 | Simko | 357/23 |

Primary Examiner—Terrell W. Fears
Attorney, Agent, or Firm—Blakely, Sokoloff, Taylor & Zafman

[57] ABSTRACT

An electrically alterable read-mostly MOS memory (commonly referred to as $E^2$ PROM) employing floating gate memory devices is described. Each word stored in memory may be separately accessed for reading and writing. The memory array is arranged with additional lines and selection means to prevent the high-level programming signals from the X-decoders from programming all the floating gate devices along a selected X-line. A high voltage circuit is described which permits the handling of potentials greater than the grounded gate breakdown voltage associated with the shallow junction devices used in the memory. A unique sensing amplifier is also disclosed which detects low currents at high speeds.

21 Claims, 5 Drawing Figures

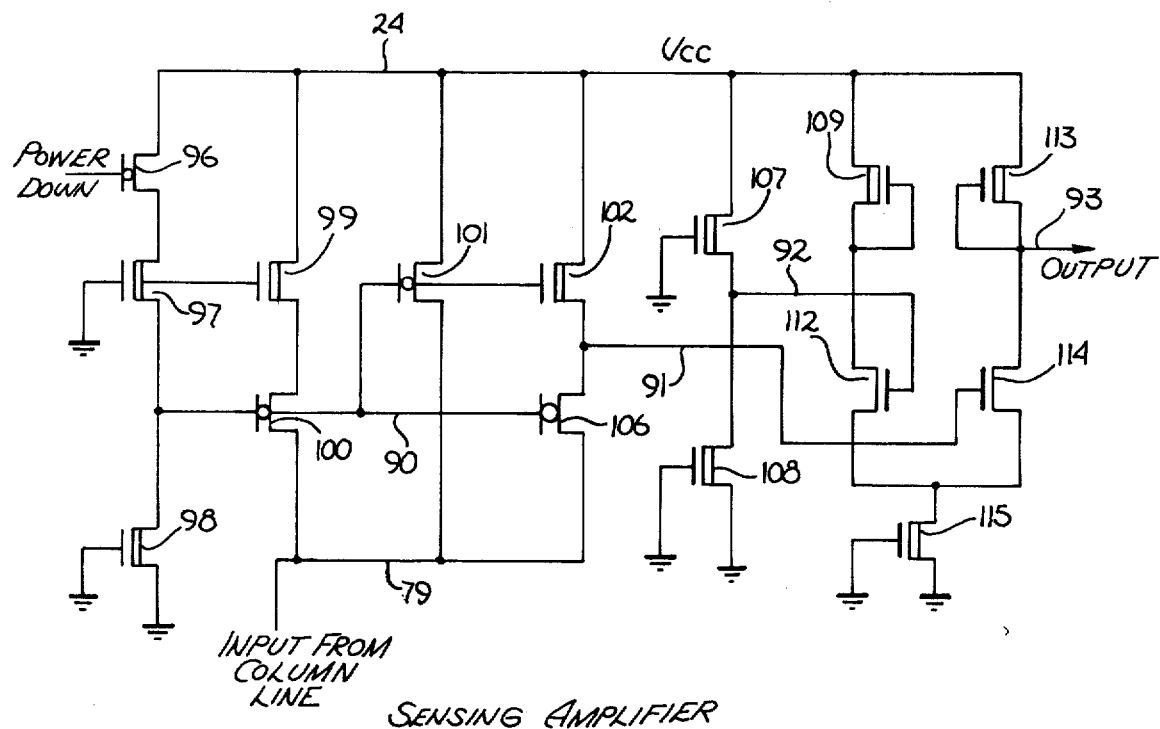
Fig. 4 Sensing Amplifier
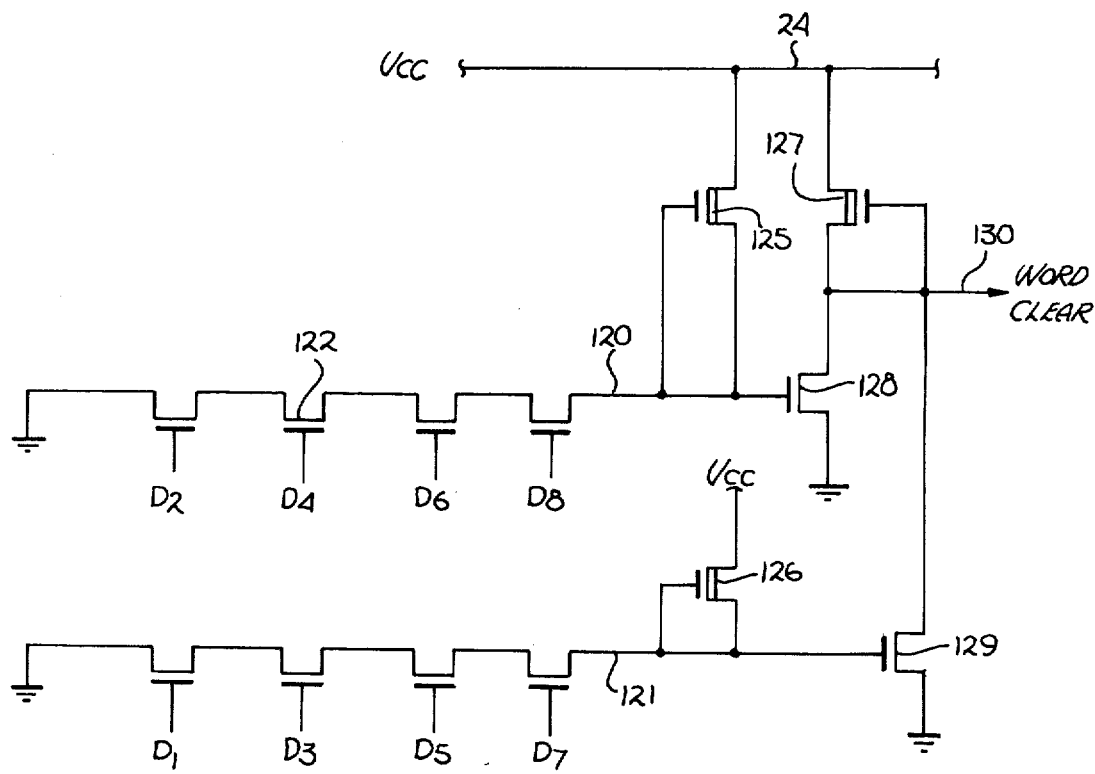
Fig. 5

4,266,283

ELECTRICALLY ALTERABLE READ-MOSTLY MEMORY

BACKGROUND OF THE INVENTION

1. Field of the Invention

The invention relates to the field of memories employing floating gate memory devices, particularly electrically programmable and electrically erasable memories.

2. Prior Art

Numerous memories are commericially available which employ floating gate memory devices programmed through avalanche injection or channel injection and erased by exposure to electromagnetic radiation. These read-mostly, non-volatile memories are typically used for storing programs or data and are frequently referred to as electrically programmable read-only memories (EPROM).

One disadvantage to these memories is that they are generally removed from their sockets when exposed to the erasing radiation. Obviously, it would be desirable to both electrically program and electrically erase these memories without removing them from their sockets or printed circuit boards. There are numerous publications discussing electrically programmable and electrically erasable floating gate read-only memories ($E^2$ PROM); however, none of these memories have been commercially realized. For examples of electrically programmable and electrically erasable floating gate memory cells and memories see U.S. Pat. Nos. 3,797,000; 3,825,946; 4,051,464; 4,119,995; *IBM Technical Disclosure Bulletin*, Vol. 15, No. 9, February, 1973; and *IEEE Journal of Solid State Circuits*, Vol. SC-12, No. 5, October, 1977, in an article entitled, "An 8192-Bit Electrically Alterable ROM Employing A 1-Transistor Cell With Floating Gate".

The only commercially realized $E^2$ PROMs known to Applicant are those employing silicon nitride layers for storage, frequently referred to as MNOS devices. These memories are difficult to use and often unreliable. Also, for the most part, these memories are relatively slow since they employ p-channel technology.

As will be described, the disclosed memory overcomes problems associated with currently available $E^2$ PROMs in that the described memory is easy to use, reliable and relatively fast.

SUMMARY OF THE INVENTION

A read-mostly memory having a plurality of electrically alterable memory cells is disclosed. Each of the cells is disposed at the intersection of the transverse X-lines and Y-lines of the memory array. The particular movement of the present invention enables the alteration of an n-bit word stored in the memory. A plurality of first lines are included in the memory array generally parallel to the Y-lines; these first lines are disposed between every nth and nth+1 Y line. A plurality of second lines, generally parallel to the X-lines, are also included within the array and disposed between each of the Y-lines. These second lines extend generally between the first lines and are coupled to the memory cells. Selection means are also employed for coupling selected first lines and second lines so as to isolate the desired word. In this manner, a single word stored in the memory may be electrically altered without disturbing the remainder of the words stored in the memory.

DETAILED DESCRIPTION OF THE DRAWINGS

FIG. 4 is an electrical schematic of the sensing amplifier employed in the memory of FIG. 1.

FIG. 5 is an electrical schematic of a portion of the circuitry used to provide a "word clear" signal in the memory of FIG. 1.

DETAILED DESCRIPTION OF THE INVENTION

Figure 1:
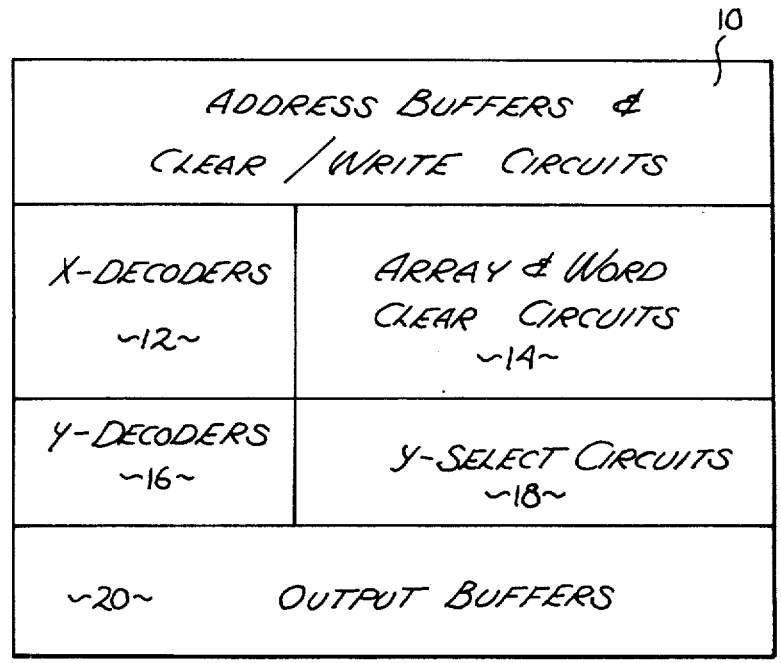
FIG. 1 is a diagram illustrating the general layout of the presently preferred embodiment of the invented memory.

A metal-oxide-semiconductor (MOS) integrated circuit memory commonly referred to as an electrically programmable and electrically erasable read-only memory ($E^2$ PROM) is disclosed. In the following description, numerous specific details such as threshold voltages, number of bits, etc. are described to provide a thorough understanding of the invented memory. However, it will be obvious to one skilled in the art that the inventive concepts disclosed in this application may be employed without these specific details. In other instances, well-known circuits such as decoders, buffers, etc. have not been set forth in detail in order not to obscure the present invention in unnecessary detail.

In the currently realized embodiment, a 16K memory in a 2K×8 organization is fabricated. The memory array includes 128 X-lines identified in FIG. 3 as lines $X_0$ through $X_{127}$ and 128 Y-lines or column lines. The memory is fabricated employing MOS technology; n-channel devices with polycrystalline silicon gates are used. Access times of 200 nsec., or better, are obtained with maximum power dissipation of approximately 500 m watts. The inputs and outputs to the memory include 11 address lines, 8 input/output lines, a chip-enable line ($\overline{CE}$) and an output-enable line ($\overline{OE}$). A 5-volt power supply ($V_{cc}$) and a high voltage supply of 20±1 volt ($V_{P/E}$) for programming and erasing are used.

The specific processing used for fabricating the memory results in four different transistor types (in addition to the floating gate memory device); each of these types has a different threshold voltage. This process, which is generally disclosed in U.S. Pat. No. 4,052,229, employes a high resistivity p-type silicon substrate (50 ohm/cm) resulting in high mobility devices with low body effect.

One transistor type employed in the memory is an enhancement mode transistor having a threshold voltage of approximately 0.7 volts. This transistor is illustrated in the figures by the standard field-effect symbol, such as transistors 82 and 83 of FIG. 3. The second transistor type employed in the memory is a depletion mode transistor having a threshold voltage of approximately −3.0 volts. The symbol designation used for this transistor type is shown by transistor 57 in FIG. 3. The third transistor type which results from this process is a "weak" depletion mode device having a threshold voltage between −1.2 to −1.8 volts; this device is not employed in the present invention. The last transistor type has a threshold voltage approximately equal to 0 volts. In typical fabrication, the thresold voltage of these devices ranges between −0.3 to +0.2 volts. This device is referred to in this application as a "zero" threshold transistor or device, since its threshold voltage is approximately zero volts. The symbol employed for this device includes a small "o" under the gate, as shown in FIG. 4 by transistors 96 and 100.

Figure 3:
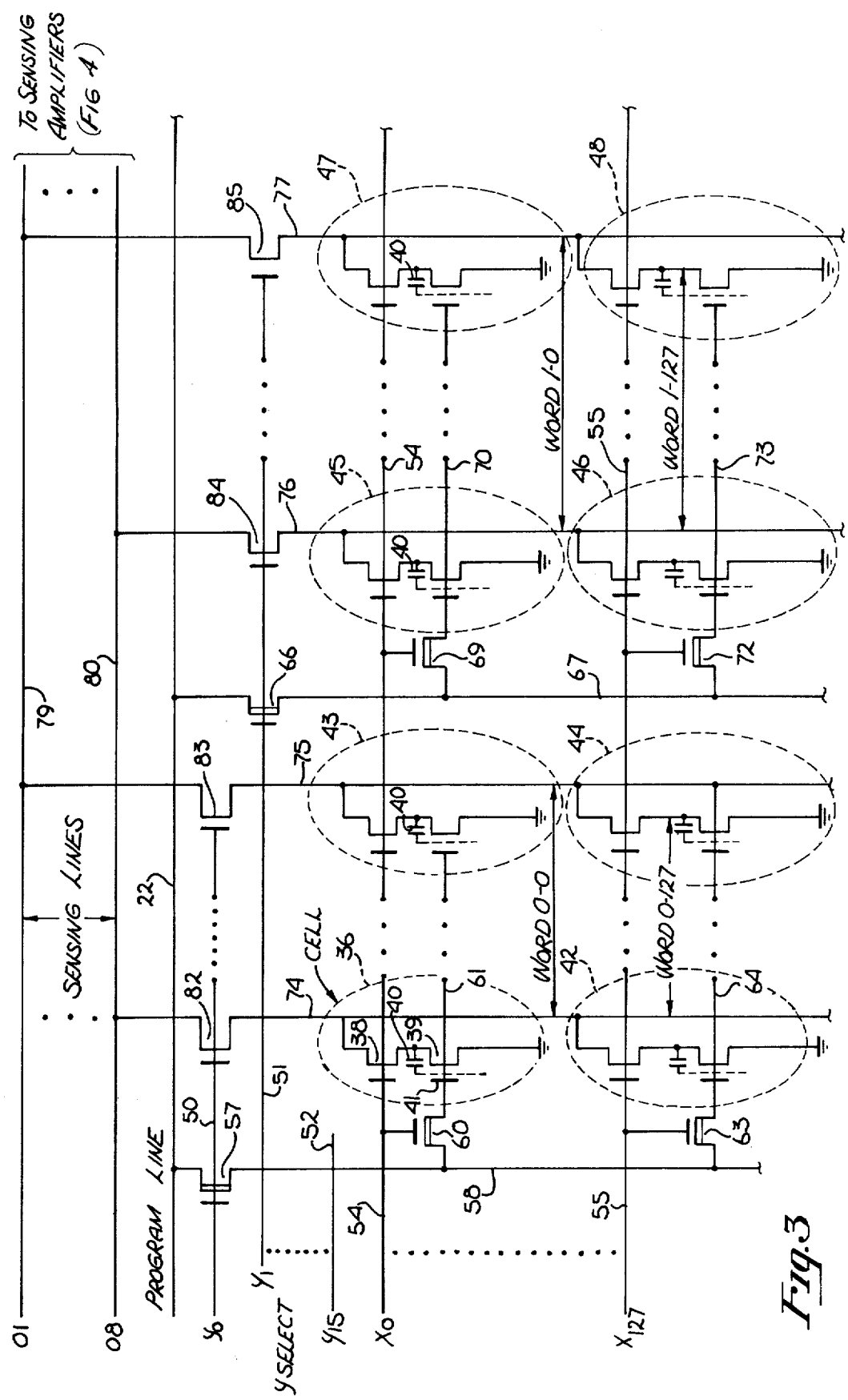
FIG. 3 is an electrical schematic of a portion of the array of the memory of FIG. 1.

The memory cells used in the memory, such as cell 36 of FIG. 3, each include a field-effect transistor 38 and a floating gate memory device 39. The transistor is used to select the floating gate memory device and couple it to a column line in the array. Each of the floating gate memory devices includes a floating gate disposed above a channel and a control gate such as control gate 41. In the presently preferred embodiment, charge is transferred into and removed from the floating gate through a thin oxide region. This thin oxide region is represented by a capacitor such as capacitor 40 shown coupled to the floating gate of the memory device 39.

The specific cell employed is fabricated employing two layers of polycrystalline silicon. This cell in its currently preferred embodiment and method of fabrication is described in copending application Ser. No. 969,819, filed Dec. 15, 1978, entitled "Electrically Programmable and Erasable MOS Floating Gate Memory Device Employing Tunneling and Method of Fabrication of Same", assigned to the assignee of this application, now U.S. Pat. No. 4,203,158. The cell generally shown in FIG. 5, with the improvement described in conjunction with FIGS. 13 and 14 of this copending application, is used. The memory device of this cell has a threshold voltage of approximately −1 volt when the floating gate is erased (slightly positively charged) and a threshold voltage of approximately 7 volts when the floating gate is programmed (negatively charged).

For purposes of this application, a memory device stores a binary-one when its floating gate is programmed, that is, negatively charged. This is also referred to as "clearing" in this application. A memory device stores a binary-zero when its floating gate is erased (slightly positively charged). This binary state is obtained by "writing" for the adopted convention To program/clear a device, the drain terminal of the cell is coupled to ground while a potential of approximatley 20 volts is applied to the control gate. This causes electrons to tunnel through the thin oxide into the floating gate. To write/erase, the control gate is coupled to ground while a potential of approximately 20 volts is applied to the drain terminal. This causes the electrons to tunnel back through the thin oxide in the substrate from the floating gate.

Referring now to FIG. 1, the memory includes a plurality of address buffers and clear/write circuits 10. Ordinary buffers are employed for the address buffers, and thus are not discussed in this application. The pertinent portions of the clear/write circuits are described in conjunction with FIG. 5. The X-decoders 12 and Y-decoders 16 receive address signals and decode them in an ordinary manner. Well-known decoders may be employed for this function. The memory array 14 includes additional circuitry necessary to implement the word-clear function. As will be described in greater detail, a single word stored within the array may be electrically altered. A portion of the array and the circuitry used for implementing the word-clear function is described in conjunction with FIG. 3. The Y-select circuits 18 are also shown in FIG. 3.

The output buffers 20 include a plurality of sensing amplifiers. These sensing amplifiers are described in detail in conjunction with FIG. 4.

As mentioned, one of the features of the invented memory is the fact that a single word (8 bits, as presently organized) may be electrically altered. In prior art floating gate memory arrays (EPROMs), the high voltage required to program a device is applied to all the control gates of the memory devices along a selected X-line. A high voltage, however, is also required on the drain terminals of the devices to provide the hot electrons for programming. Thus, a single device can be readily isolated for programming. For the floating gate memory devices used in the memory of FIG. 1, a high voltage is only required on the control gate to program the devices because the tunneling used to charge the floating gates does not require hot electrons from the channel. When an X-line is selected for programming, all the devices along that X-line would be simultaneously programmed if the typical prior art array organization is used. This would prevent the clearing of a single bit or a single word. In order to permit the clearing of a single word in the array, a unique organization for the array, shown in FIG. 3, is used.

MEMORY ARRAY ORGANIZATION

The portion of the memory array show in FIG. 3 includes a plurality of polysilicon X-lines and metal Y-lines. Two such X-lines, lines 54 and 55, are shown. As mentioned, 128 of these lines are employed in the presently preferred embodiment. The Y-lines or column lines are disposed generally transverse to the X-lines and include the lines 74, 75, 76 and 77. The X-lines are coupled to the X-decoders so as to permit the selection of a single X-line in response to an address. Each of the Y- or column lines is coupled through a transistor to one of eight sensing lines. For example, the column line 74 is coupled through transistor 82 to a sensing line 80. Similarly, the column line 75 is coupled through transistor 83 to the sensing line 79. These sensing lines are coupled to eight sensing amplifiers to provide the 8-bit output of the memory. The transistor 82 and 83, and similarly the transistors 84 and 85, select column lines; the gates of these transistors are coupled to Y-select lines in the array. For example, the gates of transistors 82 and 83 are coupled to the $Y_0$-select line 50. Similarly, the gates of transistors 84 and 85 are coupled to the $Y_1$-select line 51. In a similar manner, the other 14 Y-select lines are coupled to transistors used to select column lines. It should be noted that in the organization shown in FIG. 3, line 50 is coupled to eight adjacent column-select transistors, two of which are illustrated (transistors 82 and 83). When a signal is applied to the $Y_0$-line, a single word, such as Word 0-0, is selected. Similarly, when a signal is applied to the $Y_1$-line, eight column lines are selected, including column lines 76 and 77. Depending upon the selected X-line, one of the Words 1-0 through 1-127 is selected.

A memory cell is disposed generally at the intersection of each of the X-lines and Y-lines in the array. For example, cell 36 is disposed generally at the intersection of lines 54 and 74 and similarly cells 42, 43, 44, 45, 46, 47 and 48 are disposed at the intersection of their respective X- and Y-lines. Referring to cell 36, the drain terminal of transistor 38 is coupled to the column line 74. The gate of this transistor is defined by the line 54 (a second level polysilicon line). This transistor allows the drain of the memory device 39 to be coupled to the column line for reading and also for receiving the high potential for erasing. The remaining cells are coupled to their respective X- and Y-lines in an identical manner.

The array of FIG. 3 includes a plurality of metal lines generally parallel to the column lines and disposed at equal intervals in the array, such as lines 58 and 67. These lines occur at the beginning of the areas designated for storing each 8-bit word, and thus occur between every eighth and ninth column lines for the 8-bit words employed in the described embodiment. The lines are coupled to a common line identified as program line 22. Each of these lines is coupled to the line 22 through a depletion mode transistor which has its gate coupled to one of the Y-select lines. For example, the line 58 associated with Word 0-0 to Word 0-127 is coupled through the depletion mode transistor 57 to line 22. The gate of this transistor is coupled to the $Y_0$-select line. Similarly, line 67 associated with Word 1-0 to Word 1-127 is coupled to the program line 22 through a depletion mode transistor 66. The gate of transistor 66 is coupled to the $Y_1$-select line 51. This arrangement is repeated for the entire array.

Additional polysilicon lines which are generally parallel to the X-lines in the array are also employed. These lines are disposed between each of the X-lines and generally extend the length of a single word. For example, lines 61 and 64 are generally parallel to the X-lines and extend generally from line 58 to the column line 75. Similarly, lines 70 and 73 extend between line 67 and the column line 77. Line 61 is coupled through a depletion mode transistor 60 to line 58. The gate of the depletion mode transistor 60 is coupled to $X_0$-line 54. Similarly, line 64 is coupled to the line 58 through the depletion mode transistor 63; the gate of this transistor is coupled to line 55. Lines 70 and 73 are coupled to line 67 through transistors 69 and 72, respectively, with the gates of these transistors being coupled to lines 54 and 55, respectively. This organization is repeated for the entire array.

Line 61 defines the control gate 41 of the memory device 39. Line 61 also defines the control gates of the other seven memory devices disposed along line 61. Lines 64, 70 and 73 each similarly define eight control gates of their respective memory devices.

During reading, the array is accessed in a somewhat ordinary manner. When reading the memory, a potential of approximately 3 volts is applied to the program line 22. Assume that the X-decoders and Y-decoder select lines 54 and 50, respectively. A potential is applied to the gate of transistor 60 and the 3 volt potential on line 58 is coupled to the control gates of the memory devices, such as control gate 41 and the other seven control gates along line 61. Moreover, transistors 82 and 83 and the other six transistors disposed between these transistors are selected. This allows the sense amplifiers to sense Word 0-0. In a similar manner, any word stored in the memory may be accessed.

Assume now that Word 0-0 is to be electrically altered. As presently implemented, to electrically alter a single word, the word is first cleared, that is, all the floating gates are negatively charged, and then the binary-zeros are written into the selected locations. (As will be described in greater detail in conjunction with FIG. 5, the clearing of a word is the equivalent of writing all binary-ones.) To clear Word 0-0, the $X_0$- and $Y_0$-lines are selected. The sensing lines are coupled to ground; a potential of 20 volts is applied to the program line 22. This voltage is coupled through transistor 60 to all the control gates coupled along line 61. This high positive potential on these control gates causes charge from the substrate to be transported through the thin oxide regions onto the floating gates, thus clearing Word 0-0.

To write the word "00000001" into the memory for Word 0-0, the $X_0$- and $Y_0$-lines are again selected. This time, however, the program line is held at ground potential and the high voltage is applied to the column lines associated with the binary-zeros. For the given example, a high voltage is applied to line 80 which is coupled through transistors 82 and 38 to the drain of transistor 39. This potential causes the negative charge on the floating gate to be transferred through the thin oxide region into the substrate, thereby erasing the floating gate. Note that the control gates of the memory devices are coupled to ground through transistors 57 and 60. For the given example, no potential is applied to line 75 so that cell 43 remains programmed.

Thus, because of lines 61 and 68, and like lines in the array and the selection means used for selectively coupling these lines, to the program line 22 (such as transistors 57 and 60), a single word in the array may be electrically altered.

Figure 2:
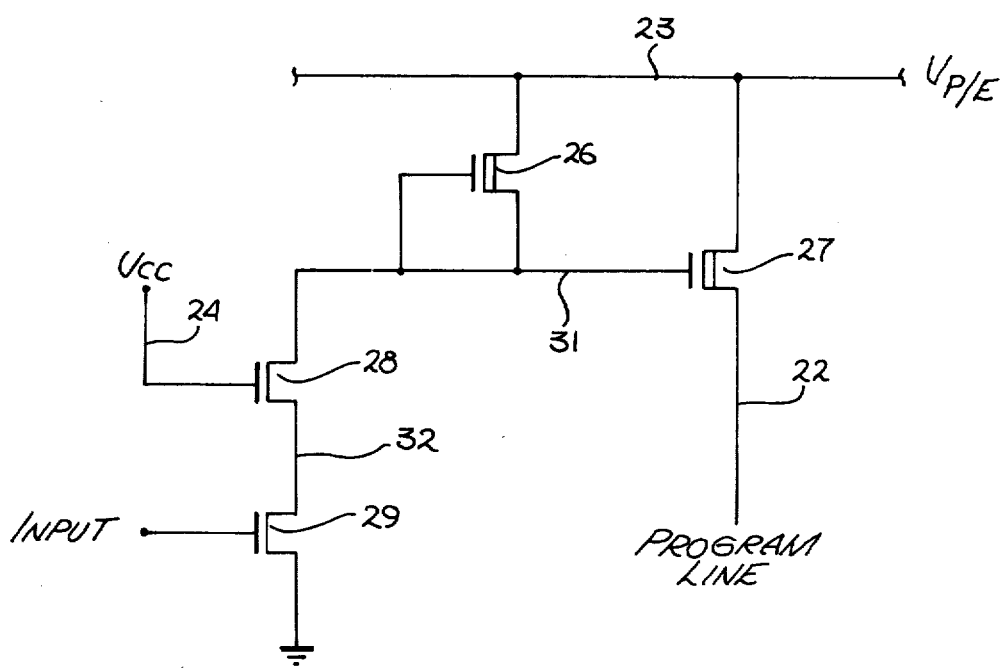
FIG. 2 is an electrical schematic of the high-voltage circuit employed in the memory of FIG. 1.

In numerous circuits in the memory, it is necessary during programming and erasing to handle voltages of approximately 20 volts. The grounded gate breakdown voltage for the shallow junction MOS devices employed in the memory is approximately 20 volts. The circuit used to handle these high voltages is shown in FIG. 2. The line 23 receives the externally applied high voltage ($V_{P/E}$) of 20 volts, $\pm 1$ Volt. For sake of discussion, the program line 22 of FIG. 3 is shown in FIG. 2. The circuit of FIG. 3, however, is used in the memory wherever it is necessary to handle the high voltage, for example, for the column lines, X-lines, Y-lines, etc. The line 22 is coupled to line 23 through a depletion mode transistor 27. The gate of this device is coupled to line 23 through another depletion mode transistor 26. The gate and source terminal (node 31) of transistor 26 is coupled to the drain terminal of an enhancement mode transistor 28. The gate of transistor 28 is coupled to $V_{cc}$; this transistor is coupled to ground through an input transistor 29. An input signal is applied to the gate of the input transistor 29.

When transistor 29 is off (grounded gate), node 31 rises in potential and is pulled to $V_{P/E}$ since transitor 26 is a depletion mode device. Because the gate of transistor 28 is coupled to $V_{cc}$, the potential on node 32 is equal to $V_{cc}$ minus the threshold voltage of transistor 28, or approximately 4 volts. Thus, transistor 29 is not subjected to the high voltage when its gate is grounded. While node 31 rises to $V_{P/E}$, transistor 28 does not break down since its gate is at $V_{cc}$. The grounded gate breakdown voltage of an MOS transitor is a function of the gate voltage; transistor 28's breakdown voltage is $V_{P/E}+V_{cc}$ or approximately 25 volts. Transistors 26 and 27 do not break down since their gates are at $V_{P/E}$. The $V_{P/E}$ potential is coupled to line 22 without any of the transistors with grounded gates being subjected to the entire $V_{P/E}$ potential. If an input signal is applied to the gate of transistor 29, this transistor conducts, preventing node 31 from charging. Thus, with the current of FIG. 2, transistor 28 prevents transistor 29 from breaking down and allows node 31 to rise to the full $V_{P/E}$ potential.

One problem in using floating gate memory devices of the type described is that slow erasing occurs even at low control gate voltages. When a cell is erased under normal operating conditions, a potential of approximately 20 volts is applied to its drain terminal, as mentioned, and erasing occurs in approximately 10 milliseconds. If the drain potential is maintained at 5 volts, erasing occurs in approximately 6 months. This slow erasing in many applications is unacceptable. With the drain voltage reduced to 3 volts, erasing occurs in approximately 10 years for most devices. In the presently preferred embodiment, during reading the drain voltage is prevented from rising above 1 volt; erasing takes approximately 100 years at this voltage for most devices. By maintaining a drain potential during reading of no more than 1 volt, at least ten years of satisfactory operation can be assured even for marginal devices. However, with this low drain voltage, much less current flows through the memory devices, making it difficult to quickly sense the binary state of the devices.

SENSING AMPLIFIER

Referring to FIG. 4, this sensing amplifier senses the low current flow in the erased cells with relatively high speed and excellent reliability. The amplifier includes an input stage comprising transistors 99, 100, 101, 102 and 106 which receive a reference potential from transistors 97 and 98. The output from this input stage, node 91, is coupled to the output stage, which comprises generally transistors 109, 112, 113, 114 and 115. This output differential stage is biased by the potential on node 92 which is generated by transistors 107 and 108.

The depletion mode transistors 97 and 98 are coupled in series through transistor 96 to $V_{cc}$. Transistor 96 prevents a flow of current through transistors 97 and 98 during non-sensing modes of operation. Since the gates of transistors 97 and 98 are coupled to ground, these depletion mode transistors provide a constant potential on node 90 substantially independent of $V_{cc}$ and process variations. The potential on node 90 biases the gates of the zero threshold transistors 100, 106 and 101, and the gate of the relatively large depletion mode transistor 102.

Transistor 100 is coupled to $V_{cc}$ through transistor 99 and transistor 106 is coupled to $V_{cc}$ through transistor 102. The source terminals of transistors 100, 101 and 106 are all coupled to a sensing line such as the sensing line of FIG. 3. A sensing amplifier is coupled to each of the eight sensing lines of FIG. 3 to provide an 8-bit output.

In the presently preferred embodiment, the reference potential developed on node 90 is approximately 1.5 volts. If line 79 is coupled to a cell which is non-conductive (negatively charged floating gate), line 79 is maintained at 1.5 volts and transistor 102 causes the potential on node 91 to rise. However, since the gate of transistor 101 is coupled to node 90, node 91 only rises to approximately one threshold voltage above the potential on node 90, or to approximately 2.5 volts.

If line 90 is coupled to a conductive cell, transistor 106 conducts and the potential on line 79 begins to drop. As soon as this potential drops approximately 0.1 volts, transistor 100 begins to conduct and current is supplied to line 79 through transistors 99 and 100. This current prevents line 79 from dropping by more than 0.1 volts below 1.5 volts. In the presently preferred embodiment, transistor 106 has a width-to-length channel ratio of 200/6 while transistor 100 has a corresponding ratio of 100/7. The difference in these channel length assures that transistor 100 has a threshold voltage of approximately 0.1 volts higher than transistor 106, independent of process variations. Thus, transistor 100 begins conducting once line 79 drops approximately 0.1 volts below the reference potential on node 90. For these conditions, the output node 91 of the input stage is maintained at approximately 1.5 volts. Thus, the total voltage swing on node 91 is between 1.5 and 2.5 volts.

The output differential stage of the sensing amplifier of FIG. 4 includes transistors 109 and 112 coupled in series between $V_{cc}$ and the drain terminal of transistor 115. Transistors 113 and 114 are likewise coupled in series between $V_{cc}$ and the drain of transistor 115. The input to this differential stage, node 91, is coupled to the gate of transistor 114. The gate of transistor 112 receives a reference potential developed by transistors 107 and 108. These transistors are depletion mode transistors with their gates coupled to ground, thus providing a reference potential substantially independent of $V_{cc}$ and process variations. In the presently preferred embodiment, the potential on node 92 is approximately 1.8 volts, which is between the voltage swing of 1.5 to 2.5 volts of the input signal on node 91. The reference potential is compared with the potential on node 91 to provide an output signal on line 93.

WORD-CLEAR FUNCTION

As presently implemented, the memory does not receive specific external signals for word-clear or word-write. It is apparent that these functions may be commanded with externally applied signals; however, use of such signals requires additional pins on the integrated circuit package. To obtain word-clear and word-write, in the presently preferred embodiment the $\overline{CE}$ signal is low and the $\overline{OE}$ signal is high. (An ordinary logic circuit is used to sense this combination of the $\overline{CE}$ and $\overline{OE}$ signals.) With this combination, both word-clear and word-write are implemented through the circuit shown in FIG. 5.

In FIG. 5, node 120 is coupled to ground through a plurality of transistors such as transistor 122. Similarly, node 121 is coupled to ground through a plurality of transistors such as transistor 123. The data input lines $D_1$ through $D_8$ are coupled to the gates of these transistors, as illustrated in FIG. 5. Node 120 is coupled to $V_{cc}$ through the depletion mode 125. Similarly, node 121 is coupled to $V_{cc}$ through the transistor 126. Node 120 is also coupled to the gate of transistor 128; and node 121 is coupled to the gate of transistor 129. The drain terminal of transistor 128 is coupled to $V_{cc}$ through depletion mode transistor 127 and to the drain terminal of transistor 129. This terminal is also common with line 130, designated as the "word-clear" line.

To implement the word-clear and word-write functions for an addressed word, the word is first cleared. As mentioned, this is equivalent to writing all binary-ones. With the $\overline{CE}$ signal low and the $\overline{OE}$ signal high, all binary-ones are applied to the data lines $D_1$ through $D_8$. When this occurs, nodes 120 and 121 are coupled to ground. This prevents transistors 128 and 129 from conducting and causes line 130 to be pulled to $V_{cc}$ through transistor 127. The word-clear signal is thus generated on line 130, clearing the addressed word. Once the addressed word is cleared, the word to be written into the memory is next applied to lines $D_1$ through $D_8$. If one of the bits includes a binary-zero, either transistor 128 or transistor 129 conducts, removing the word-clear signal. Then the data on the input lines is written into the memory devices, that is, those devices which will store a binary-zero are erased. Therefore, by implementing the word-clear and word-write functions as shown, no additional pins are required.

CHIP-CLEAR FUNCTION

As presently implemented, all the cells in the array may be simultaneously cleared. This is done by holding the column lines low and raising all the X-lines and the program line to the high voltage with ordinary logic circuits and the circuit of FIG. 2. This programs all the memory devices in the array at one time. Again, no additional external signals are employed to command a "chip-clear". Rather, to obtain this function, the $\overline{CE}$ signal is held low and a potential in excess of 8 volts is applied to the $\overline{OE}$ line. An ordinary circuit for detecting this higher potential is employed to provide an internal "chip-clear" signal.

Thus, an electrically alterable read-mostly memory has been described which employs floating gate memory devices. Selected words within the memory may be erased without affecting other data in the memory. A unique sensing amplifier quickly senses the binary state of the memory devices despite the fact that the drain terminals of the devices are at a relatively low voltage to prevent slow erasing. A unique high voltage circuit enables the handling of voltages higher than the grounded gate breakdown voltage of the transistors employed in the memory.

We claim:

1. In a read-mostly memory having a plurality of electrically alterable memory cells, one of said cells being disposed at each intersection of transverse X- and Y-lines in said memory, an improvement permitting the alteration on n-bit words stored in said memory comprising:

a plurality of first lines generally parallel to said Y-lines, one of said first lines being disposed between every nth and nth+1 Y-line;

a plurality of second lines generally parallel to said X-lines and disposed between each of said X-lines, said second lines extending generally between said first lines and being coupled to said cells;

selection means for coupling selected ones of said first and second lines such that a single word stored in said memory is electrically alterable;

whereby a single word stored in said memory may be electrically altered without disturbing the remainder of the words stored in said memory.

2. The improvement defined by claim 1 wherein said selection means is coupled to receive control signals from said X-lines.

3. The improvement defined by claim 2 wherein said selection means comprises a plurality of first transistors, each having its gate coupled to one of said X-lines and one of its terminals coupled to one of said second lines.

4. The improvement defined by claim 3 wherein the other terminals of said first transistors are coupled to a common line through a plurality of second transistors, the gates of said second transistors being coupled to decoders in said memory.

5. The improvement defined by claim 2 wherein said cells each include a transistor and a floating gate memory device, the gate of said transistor being coupled to one of said X-lines and the control gate of said device being coupled to one of said second lines.

6. An electrically alterable read-mostly memory comprising:

a plurality of first lines;

a plurality of second lines, generally transverse to said first lines;

a plurality of memory cells each including an electrically programmable and electrically erasable floating gate memory device, each of said cells having a first gate for selecting said cell and a second gate disposed above the channel of said device, one of said cells being disposed generally at each intersection of said first and second lines, with each of said cells being coupled to one of said first lines and with said first gate of each of said cells being coupled to one of said second lines;

a plurality of third lines generally parallel to said first lines and disposed in said memory between predetermined ones of said first lines;

a plurality of fourth lines generally parallel to said second lines and disposed in said memory between said second lines, said fourth lines extending generally between said third lines, each of said second gates of said cells being coupled to one of said fourth lines;

selection means for coupling selected ones of said third and fourth lines such that a single word stored in said memory is electrically attainable;

whereby single words stored in said memory may be electrically altered without disturbing data stored in the remainder of said memory.

7. The memory defined by claim 6 wherein said memory stores a plurality of n-bit words and wherein said third lines are disposed between every nth and nth+1 of said first lines.

8. The memory defined by claim 7 wherein said selection means is coupled to said second lines in said array.

9. The memory defined by claim 8 wherein said selection means comprises a plurality of first transistors each having a gate coupled to one of said second lines and a terminal coupled to one of said fourth lines.

10. The memory defined by claim 9 wherein said other terminals of said first transistors are coupled to a common line through a plurality of second transistors, the gates of said second transistors being coupled to Y-decoders in said memory.

11. The memory defined by claim 10 wherein said first lines are coupled to sensing amplifiers in said memory through a plurality of third transistors, the gates of said third transistors being coupled to said Y-decoders.

12. The memory defined by claim 11 wherein said second lines are coupled to X-decoders in said memory.

13. In an electrically programmable read-mostly MOS memory requiring a first voltage for reading and a second higher voltage for programming, a circuit for selecting said second voltage without subjecting transistors with grounded gates to the full potential of said second voltage comprising:

a first transistor coupled to the source of said second voltage, said first transistor providing an output approximately equal to said second voltage;

a second transistor coupled between said source of said second voltage and the gate of said first transistor;

a third transistor having one of its terminals coupled to said gate of said first transistor and its gate coupled to the source of said first potential;

a fourth transistor coupled between the other terminal of said third transistor and ground, the gate of said fourth transistor being coupled to receive a control signal for controlling said output;

whereby said second voltage may be selected without subjecting transistors with grounded gates to said second voltage.

14. The circuit defined by claim 13 wherein the gate of said second transistor is coupled to said gate of said first transistor.

15. The circuit defined by claim 14 wherein said third and fourth transistors are enhancement mode transistors.

16. In a read-mostly memory having a plurality of floating gate memory devices, a sensing amplifier comprising:
- a first and a second depletion mode transistor coupled in series between a source of potential and ground, the gates of said first and second transistors being coupled to ground;
- a first load;
- a third transistor having a threshold voltage approximately equal to zero volts, said third transistor coupled between said source of potential through said first load and an input node;
- a second load; and
- a fourth transistor having a threshold voltage greater than said threshold voltage of said third transistor, said fourth transistor coupled between said source of potential through said second load and said input node;
- the gates of said third and fourth transistors being coupled to the common junction between said first and second transistors;

whereby low currents drawn by floating gate devices coupled to said input node are sensed at an output node between said third transistor and second load.

17. The amplifier defined by claim 16 wherein said first load comprises a depletion mode transistor having its gate coupled to said gates of said third and fourth transistors.

18. The amplifier defined by claim 17 wherein said output node is coupled to a differential amplification stage.

19. The amplifier defined by claim 18 wherein said stage compares the potential on said output node with a reference potential.

20. The amplifier defined by claim 19 wherein said reference potential is generated by a pair of depletion mode transistors coupled in series, each having a grounded gate.

21. The amplifier defined by claim 20 wherein said reference potential is higher than the potential on said common junction between said first and second transistors.

* * * * *